(12) United States Patent
Li et al.

(10) Patent No.: US 11,563,110 B2
(45) Date of Patent: Jan. 24, 2023

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Yi-Yun Li, Hsinchu (TW); Tsai-Yu Huang, Taoyuan (TW); Huicheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 103 days.

(21) Appl. No.: 17/152,448

(22) Filed: Jan. 19, 2021

(65) Prior Publication Data

US 2021/0242334 A1 Aug. 5, 2021

Related U.S. Application Data

(60) Provisional application No. 62/967,734, filed on Jan. 30, 2020.

(51) Int. Cl.
| | |
|---|---|
| *H01L 29/66* | (2006.01) |
| *H01L 21/02* | (2006.01) |
| *H01L 21/225* | (2006.01) |
| *H01L 21/8238* | (2006.01) |
| *H01L 27/092* | (2006.01) |
| *H01L 29/10* | (2006.01) |
| *H01L 29/161* | (2006.01) |
| *H01L 29/78* | (2006.01) |

(52) U.S. Cl.
CPC .. *H01L 29/66818* (2013.01); *H01L 21/02532* (2013.01); *H01L 21/2254* (2013.01); *H01L 21/823807* (2013.01); *H01L 21/823821* (2013.01); *H01L 27/0924* (2013.01); *H01L 29/1037* (2013.01); *H01L 29/1083* (2013.01); *H01L 29/161* (2013.01); *H01L 29/7854* (2013.01)

(58) Field of Classification Search
CPC .......... H01L 29/66818; H01L 29/1037; H01L 29/1083; H01L 29/161; H01L 29/7854; H01L 21/02532; H01L 21/2254; H01L 21/823807; H01L 21/823821; H01L 27/0924
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |

(Continued)

*Primary Examiner* — Christine A Enad
(74) *Attorney, Agent, or Firm* — Birch, Stewart, Kolasch & Birch, LLP

(57) ABSTRACT

A method for forming a semiconductor structure is provided. The method includes forming a fin structure over a substrate and forming an isolation structure over the substrate. In addition, the fin structure is protruded from the isolation structure. The method further includes trimming the fin structure to a first width and forming a Ge-containing material covering the fin structure. The method further includes annealing the fin structure and the Ge-containing material to form a modified fin structure. The method also includes trimming the modified fin structure to a second width.

20 Claims, 19 Drawing Sheets

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 11,437,498 B2 * | 9/2022 | Wu | H01L 27/0886 |
| 2019/0304841 A1 * | 10/2019 | Sung | H01L 21/823431 |
| 2021/0111272 A1 * | 4/2021 | Wu | H01L 29/66818 |
| 2021/0391449 A1 * | 12/2021 | Liao | H01L 29/0847 |

* cited by examiner

SEMICONDUCTOR STRUCTURE AND METHOD FOR FORMING THE SAME

CROSS REFERENCE TO RELATED APPLICATIONS

This application claims the benefit of U.S. Provisional Application No. 62/967,734 filed on Jan. 30, 2020, and entitled "Semiconductor structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
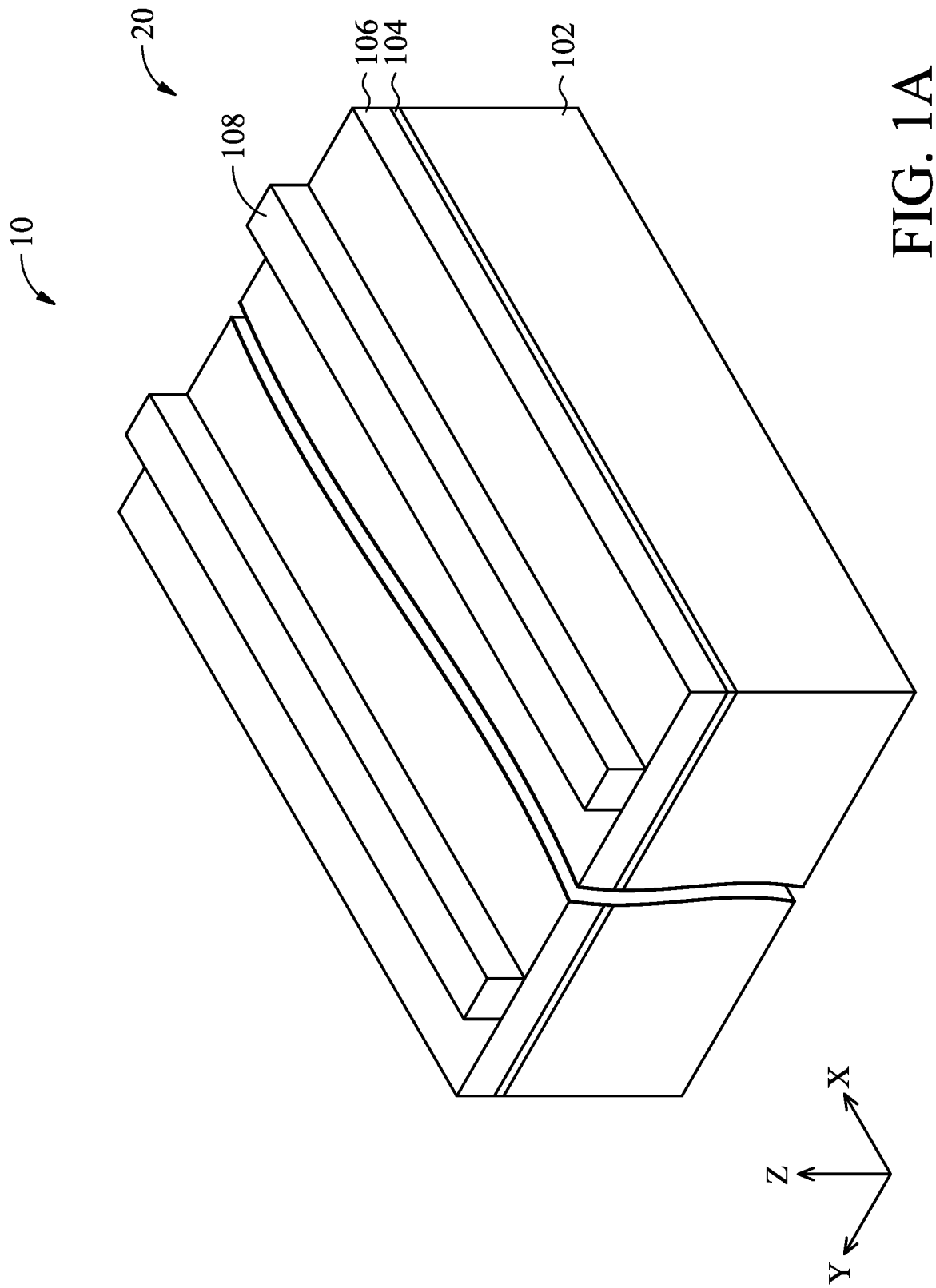
FIGS. 1A-1O are perspective representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments of a semiconductor structure and method for forming the same are provided. The semiconductor structure may include a modified fin structure which is formed by annealing the fin structure and a Ge-containing material covering thereon. Since the Ge-containing material is formed, the composition and the width of the modified fin structure may be precisely controlled. Therefore, the over oxidized SiGe fin may be avoided, and/or a better N-bias/P-bias may be reached.

Figure 1B:
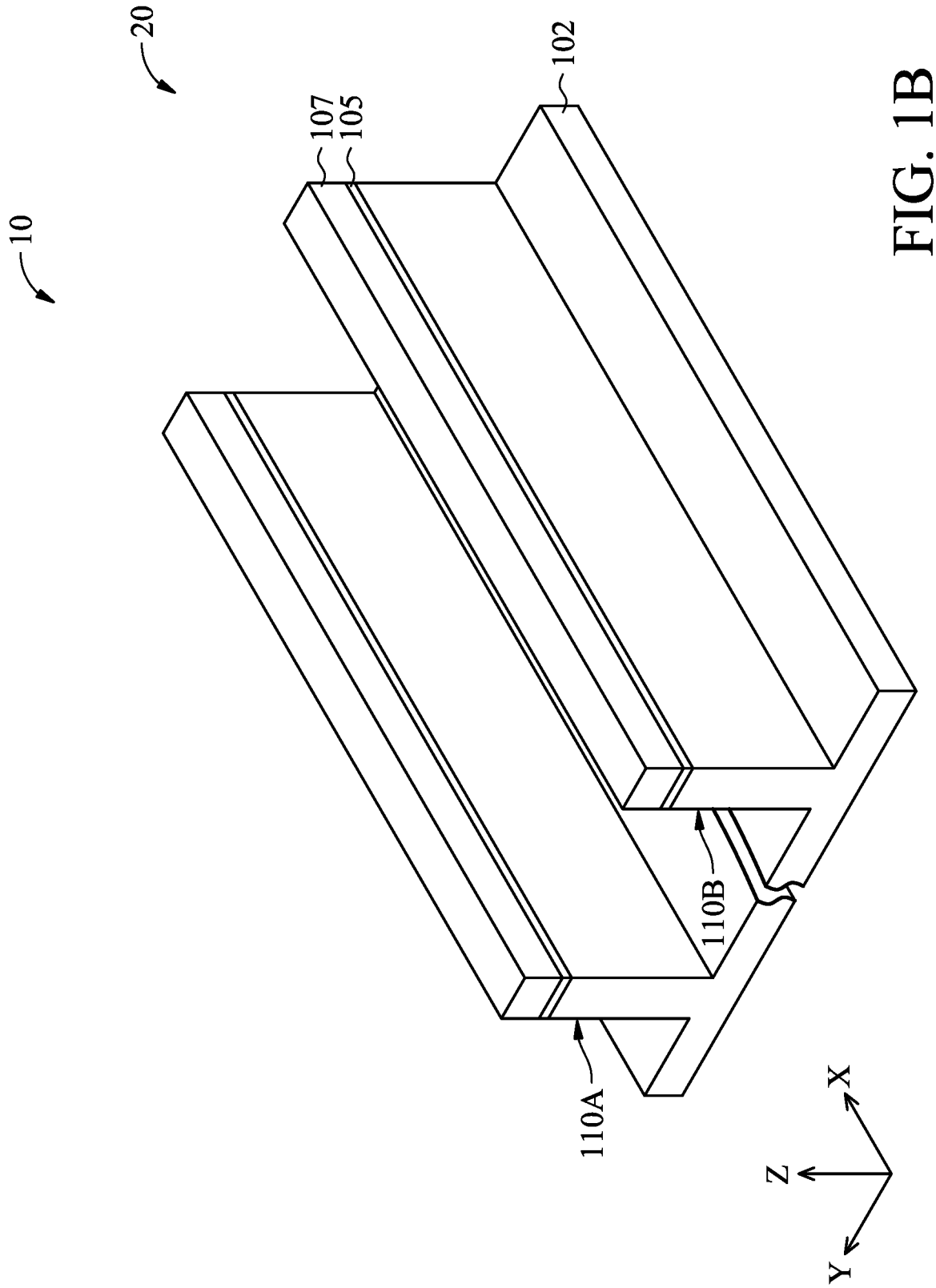
Figure 1C:
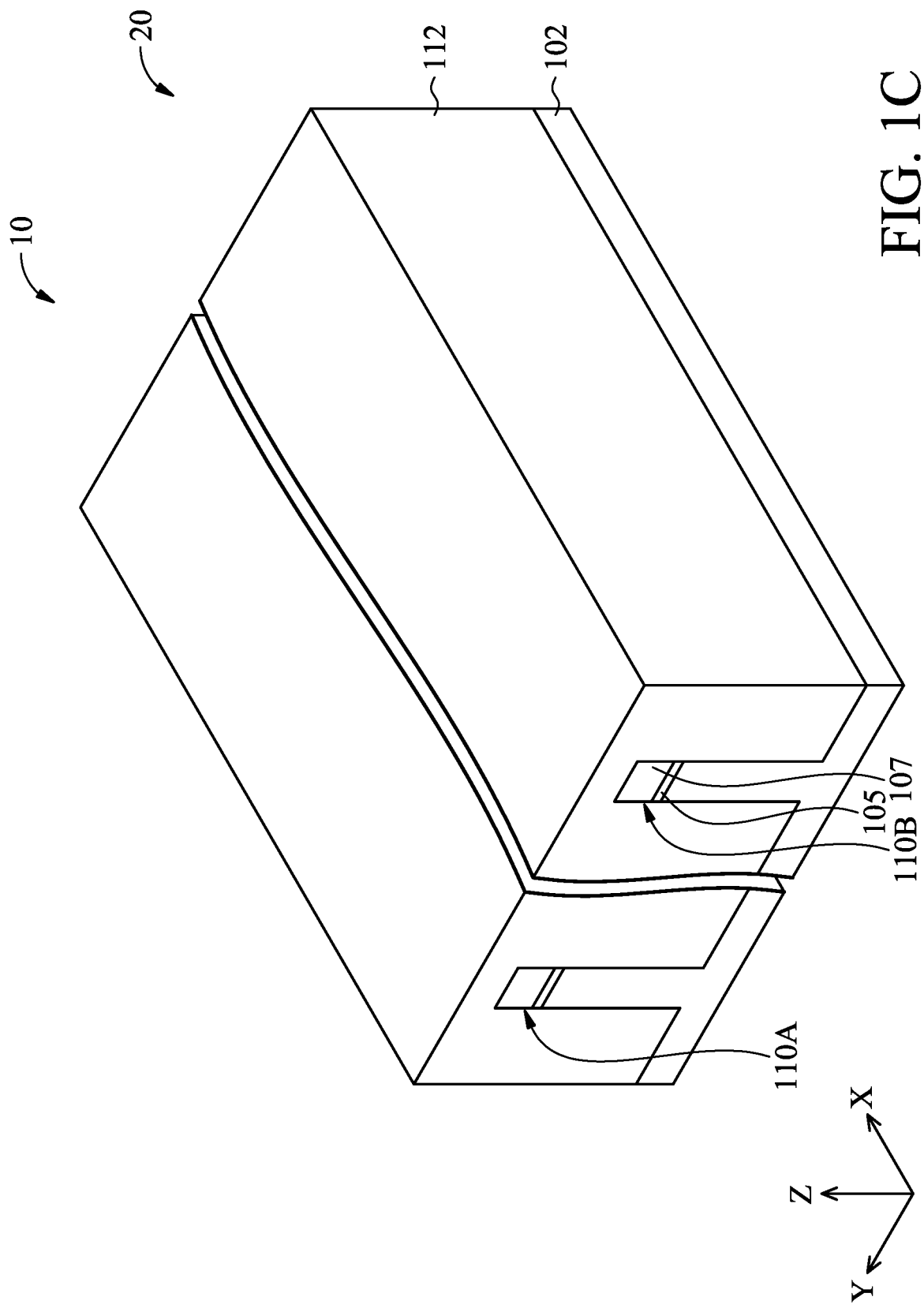
Figure 1D:
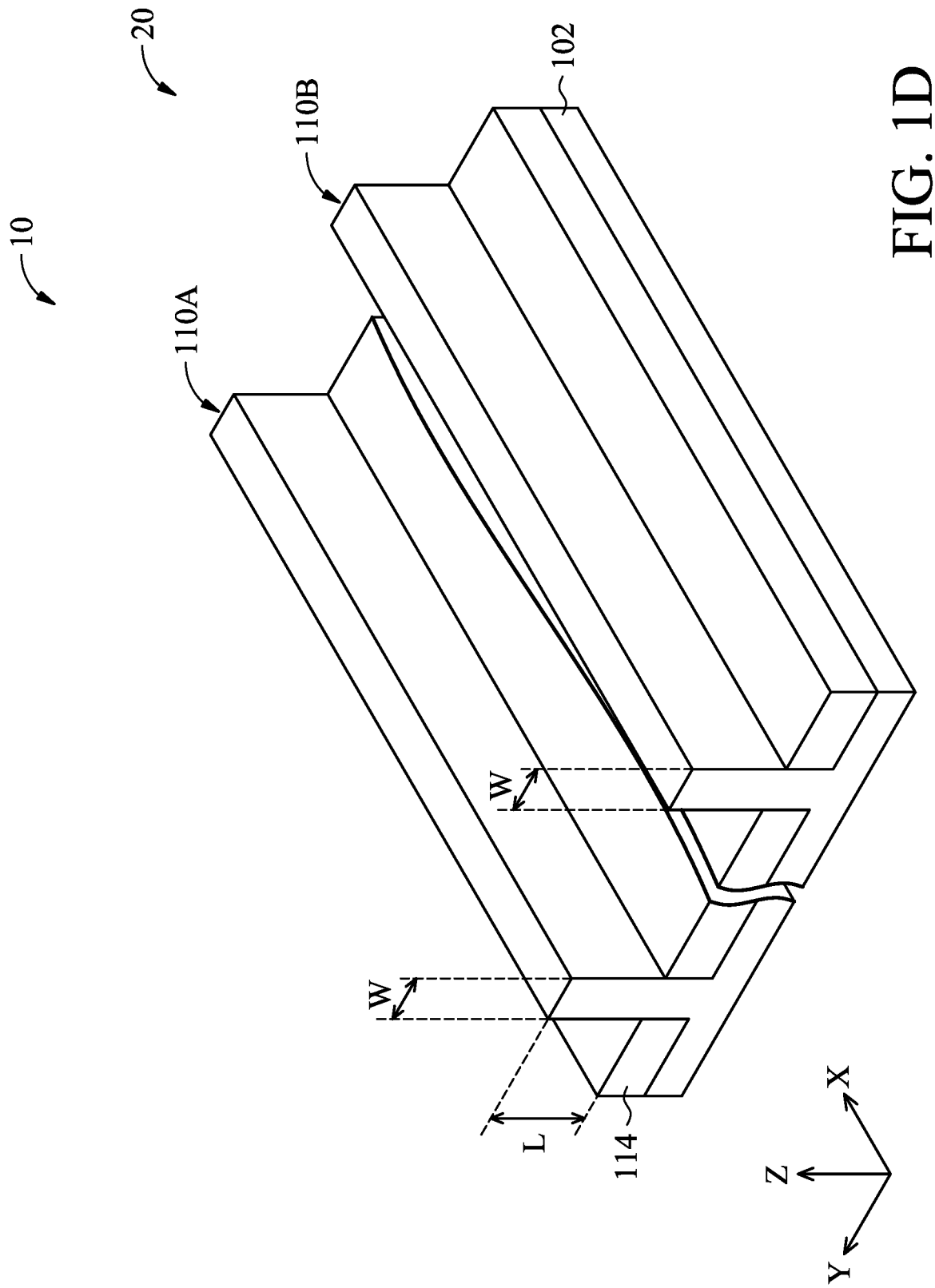
Figure 1E:
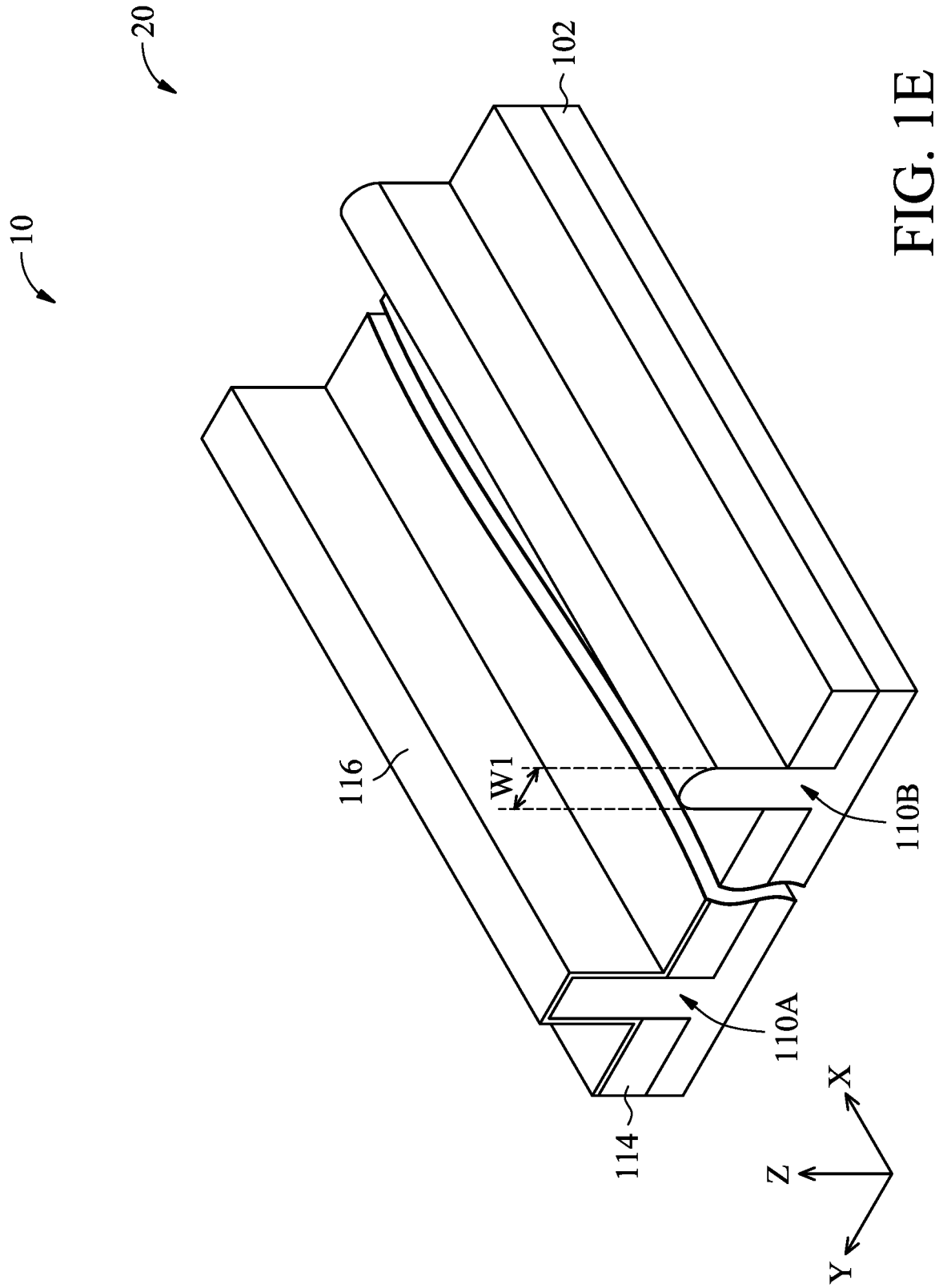
Figure 1F:
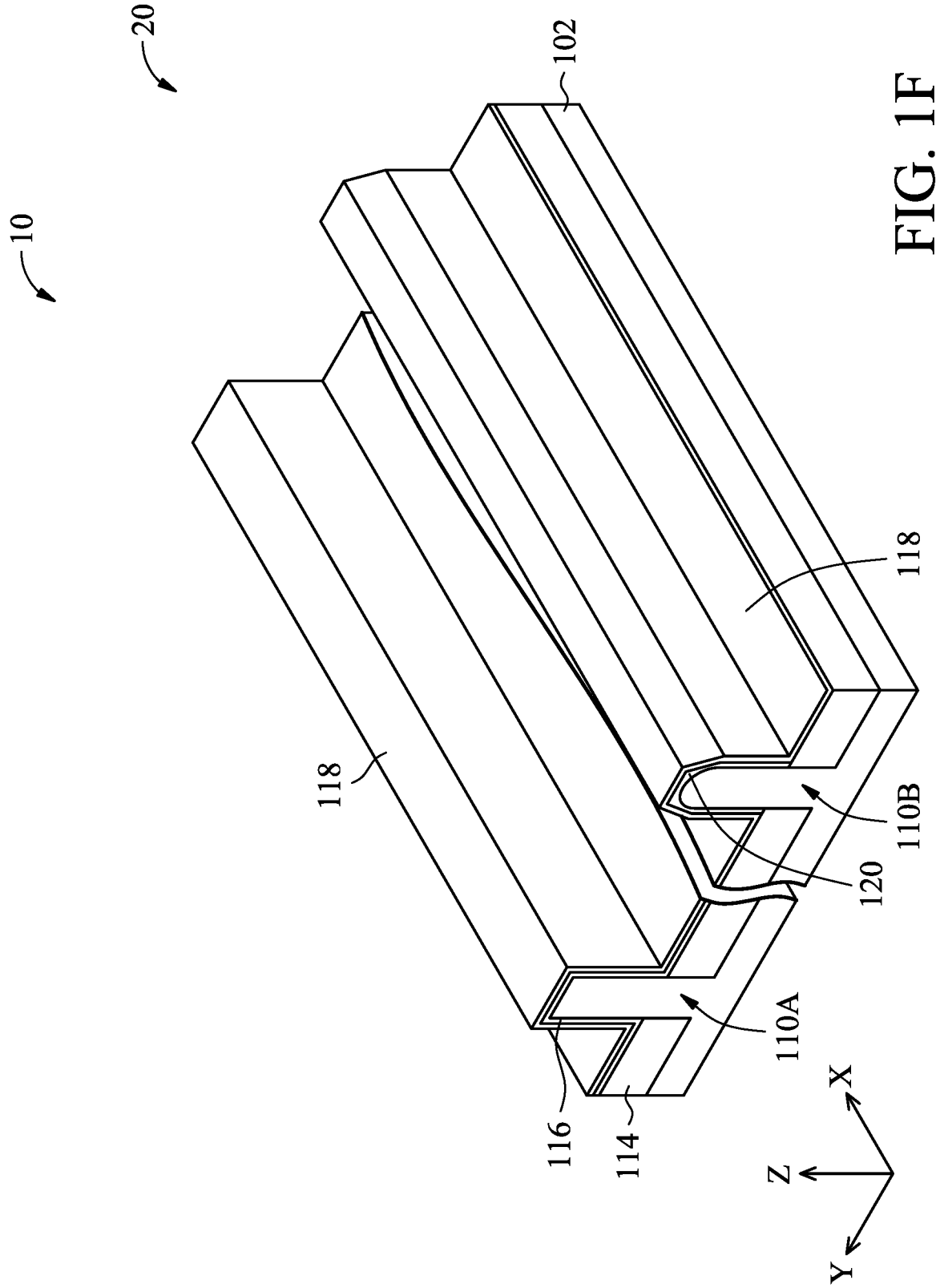
Figure 1G:
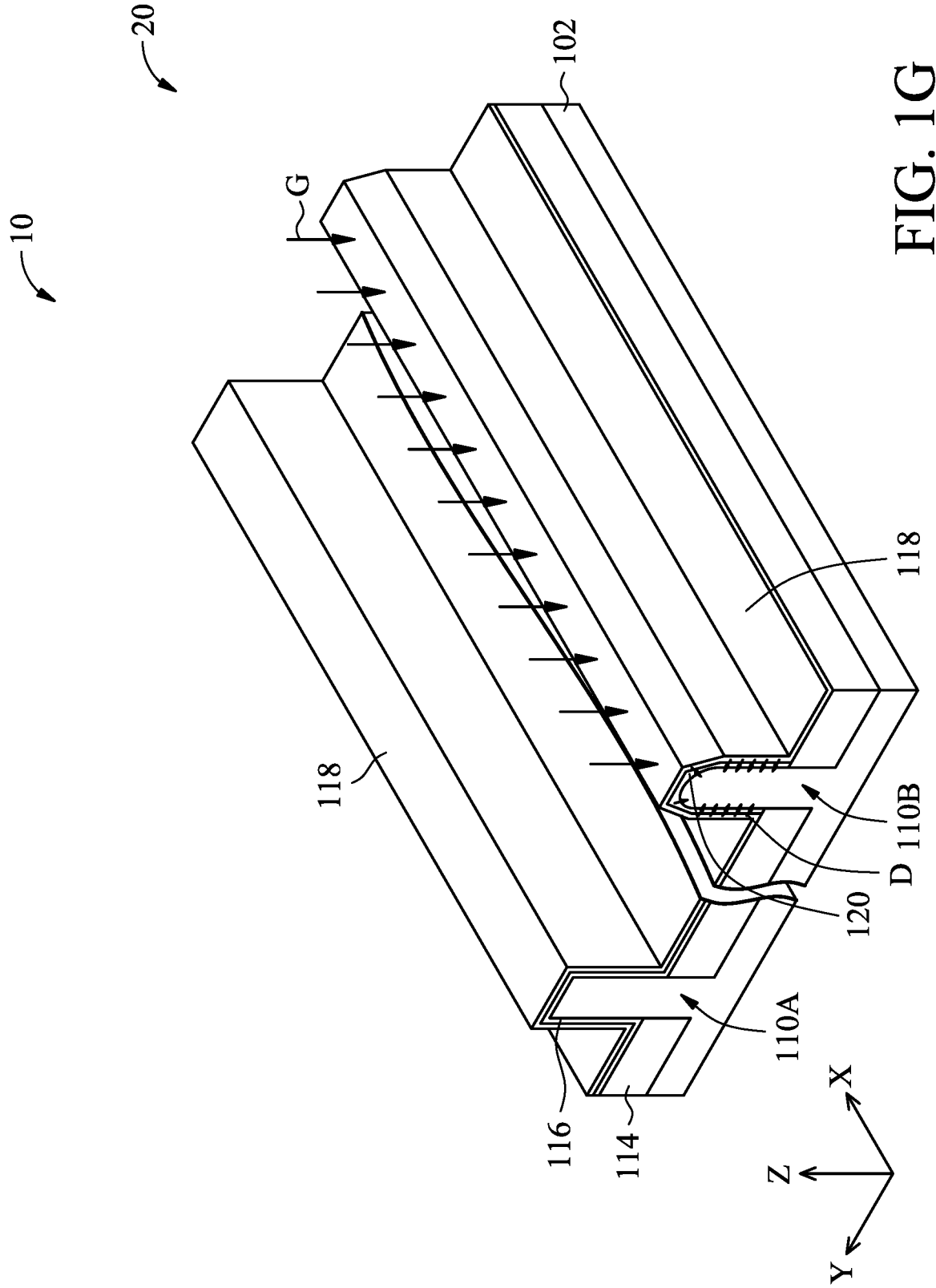
Figure 1H:
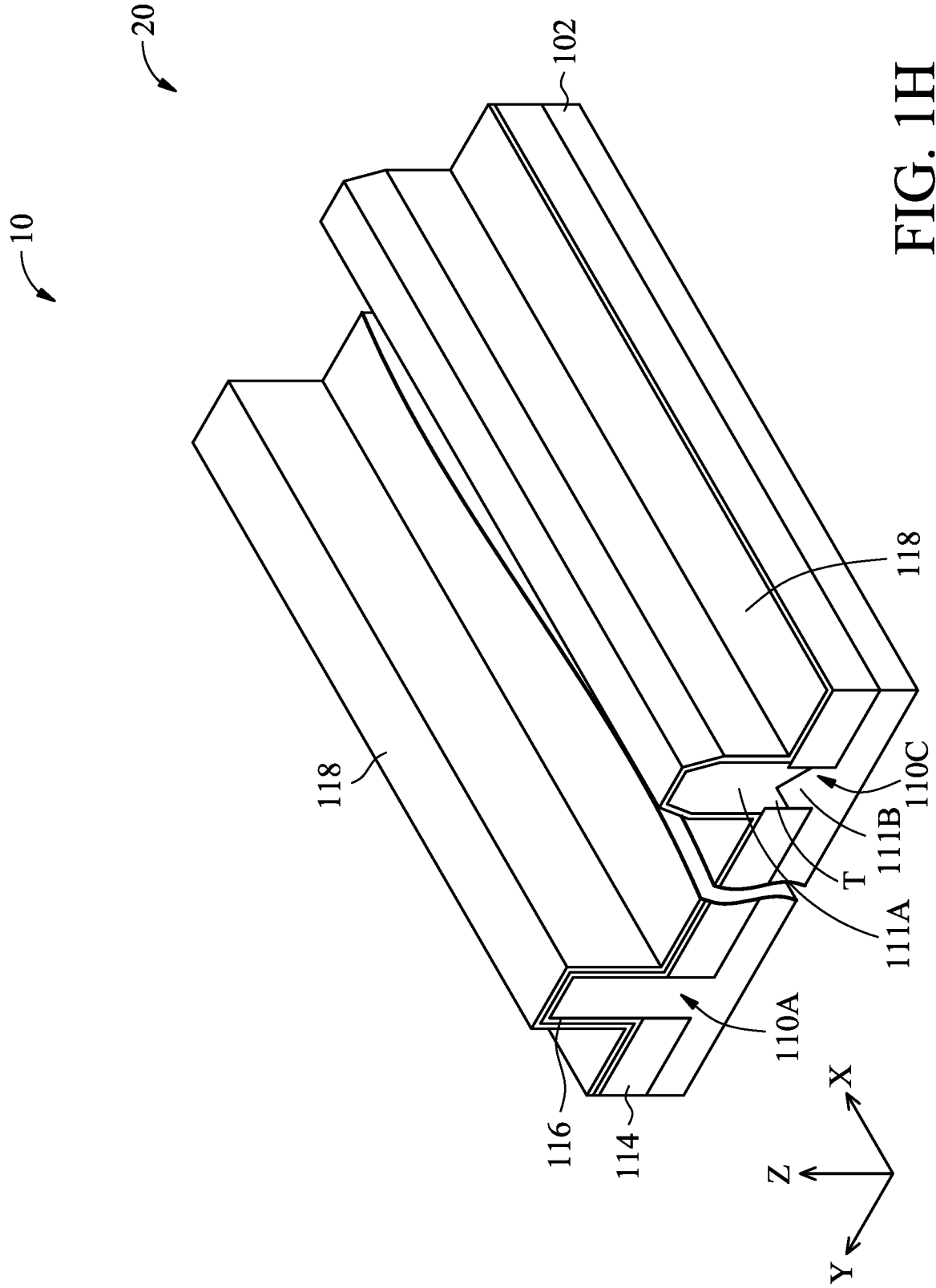
Figure 1I:
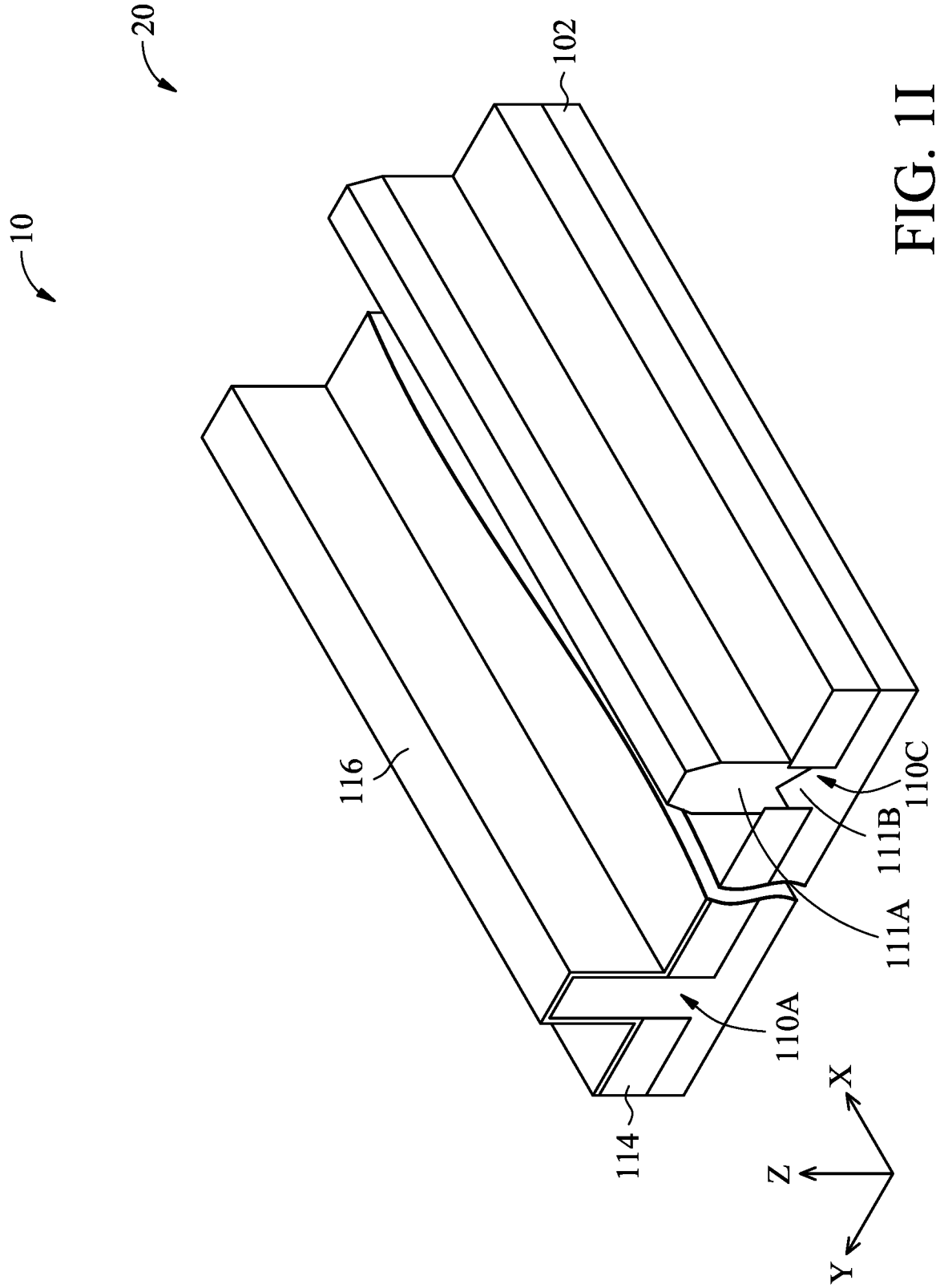
Figure 1J:
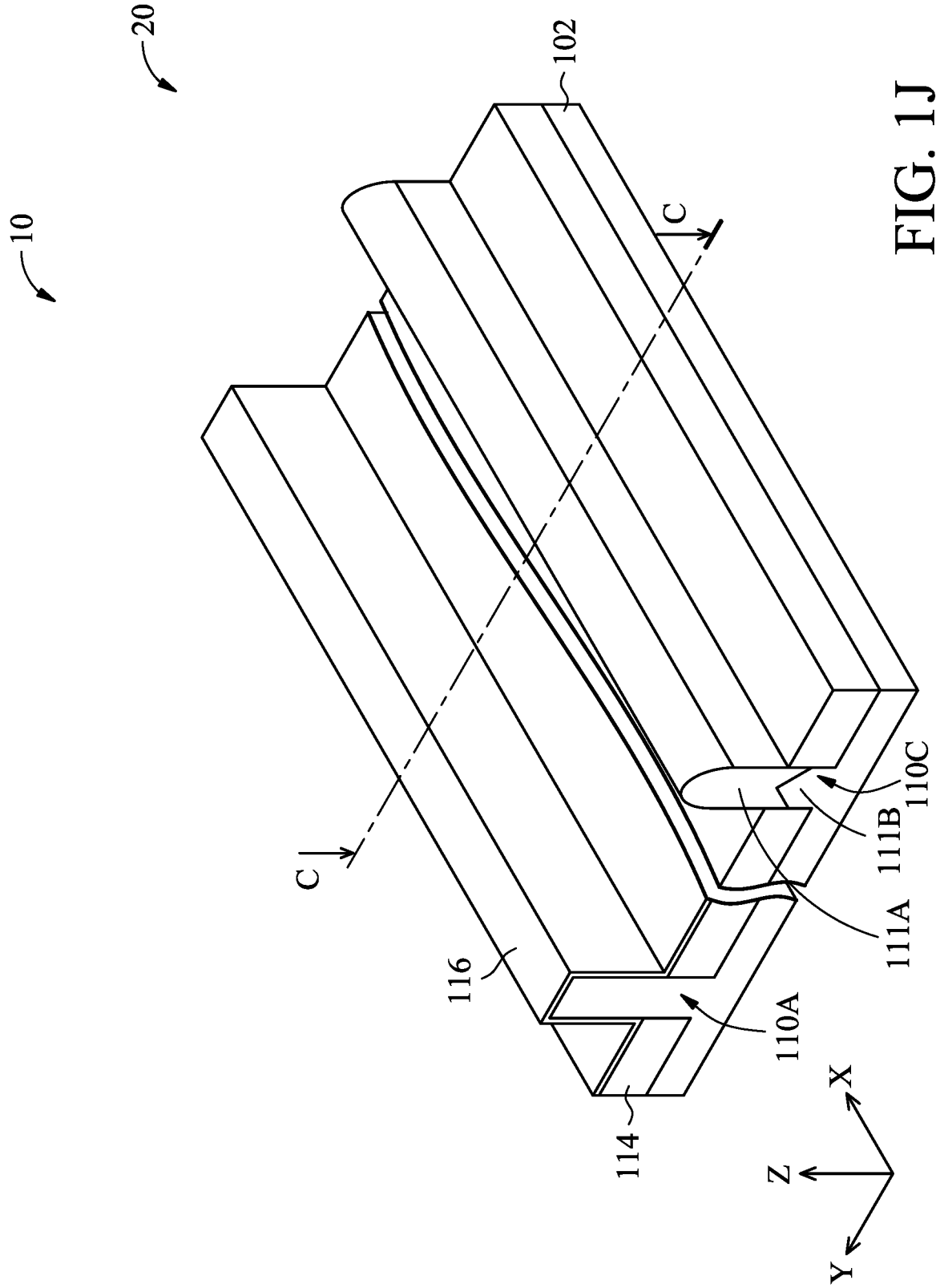
Figure 1K:
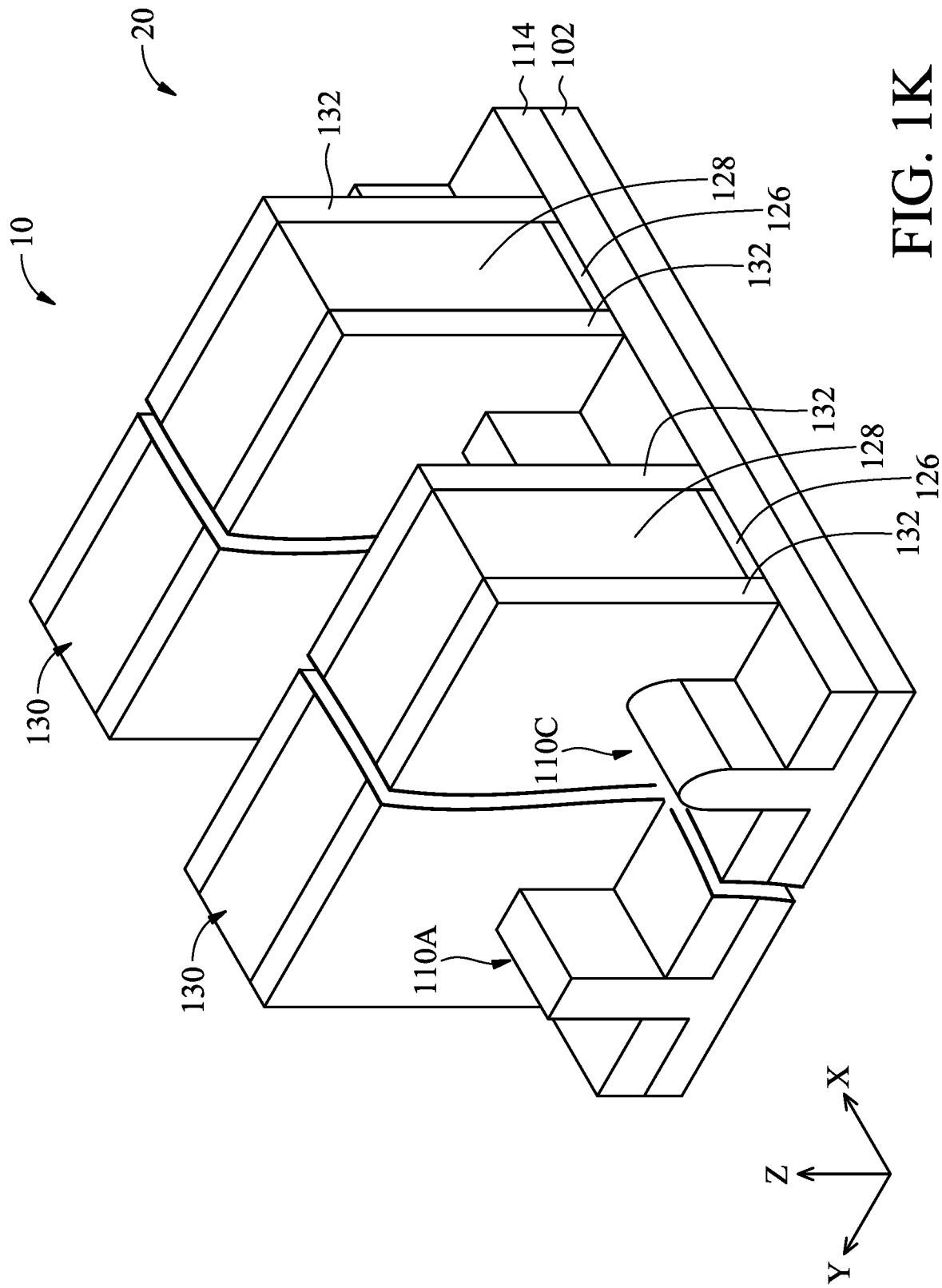
Figure 1L:
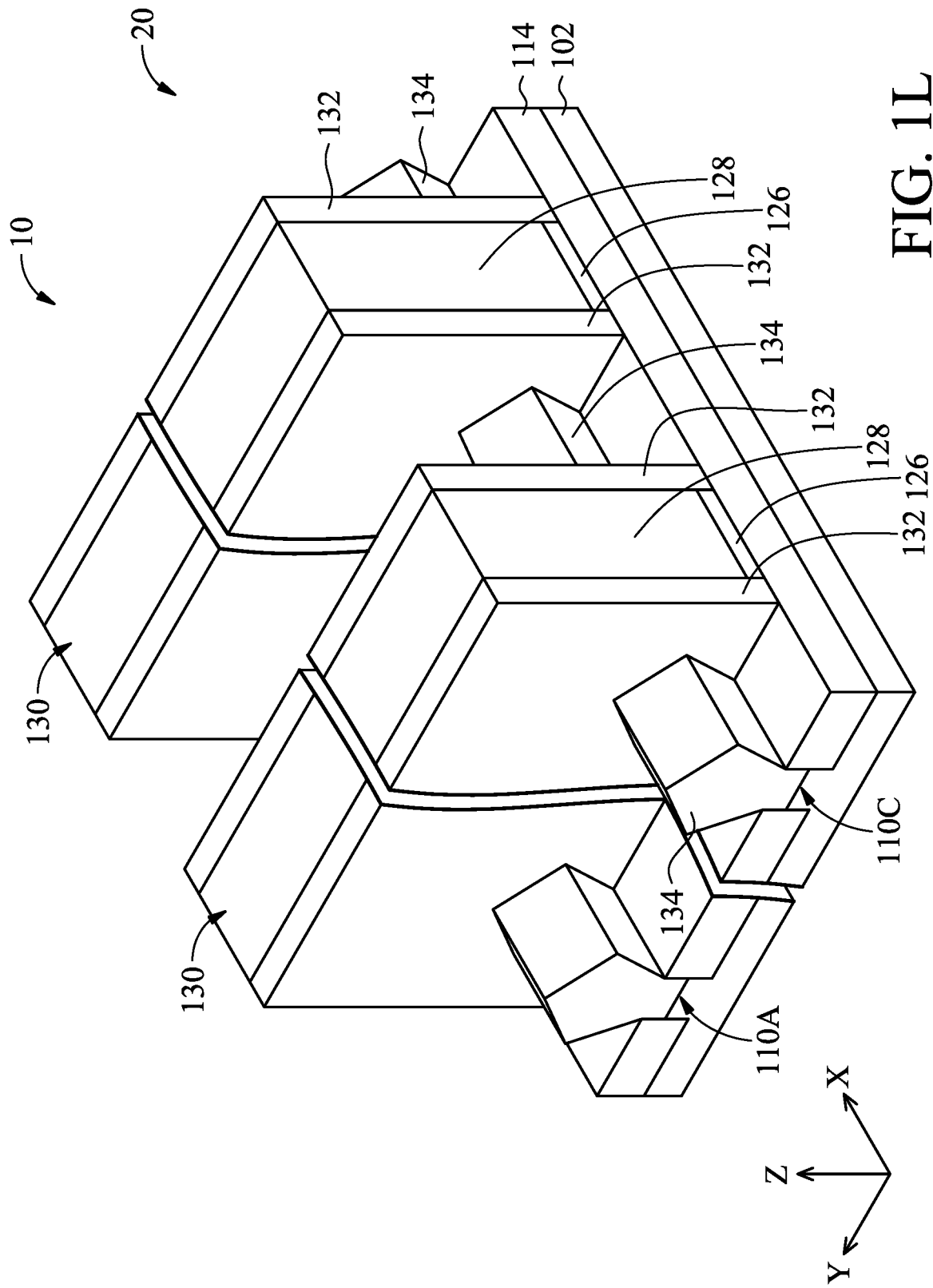
Figure 1M:
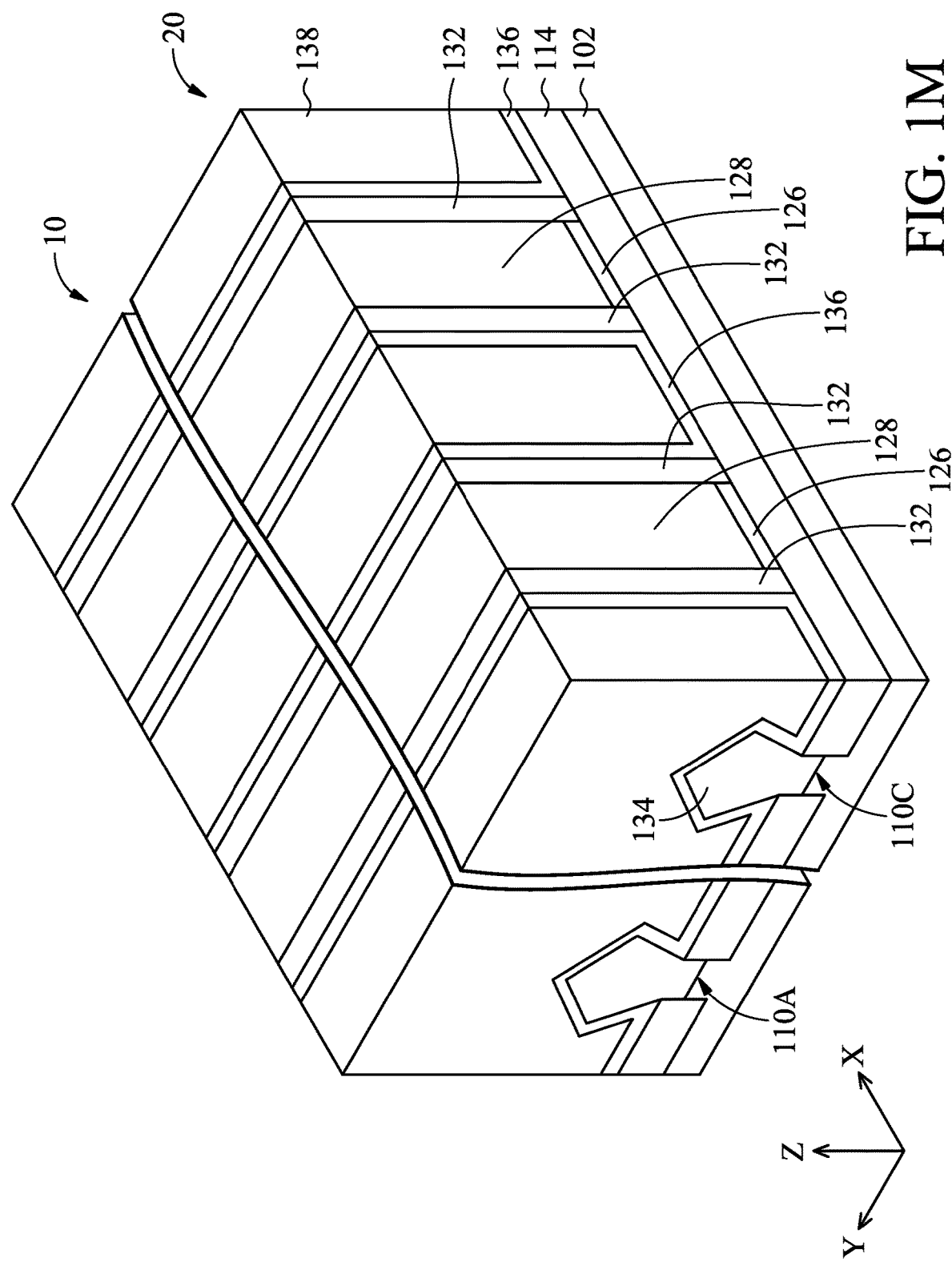
Figure 1N:
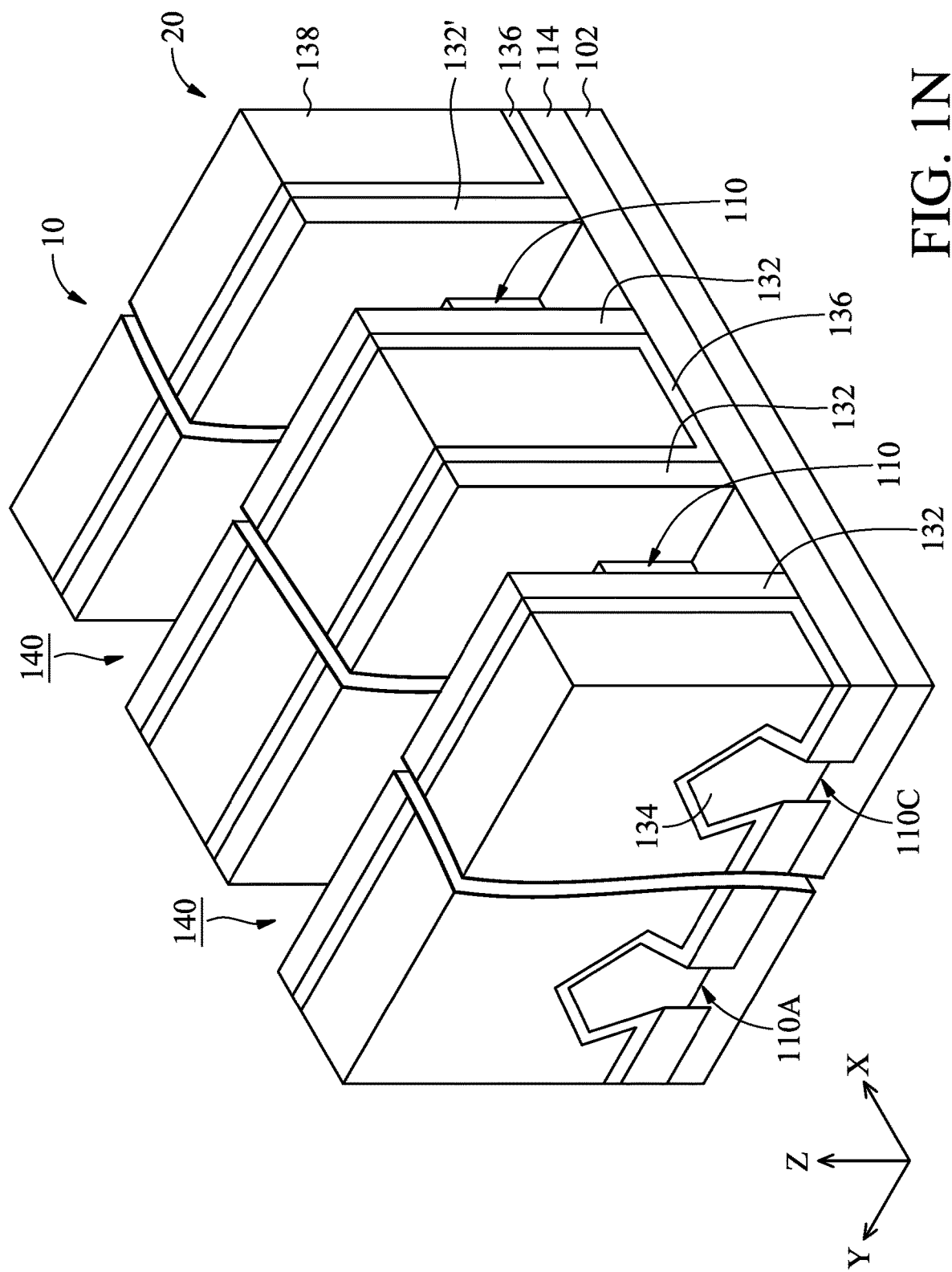
Figure 1O:
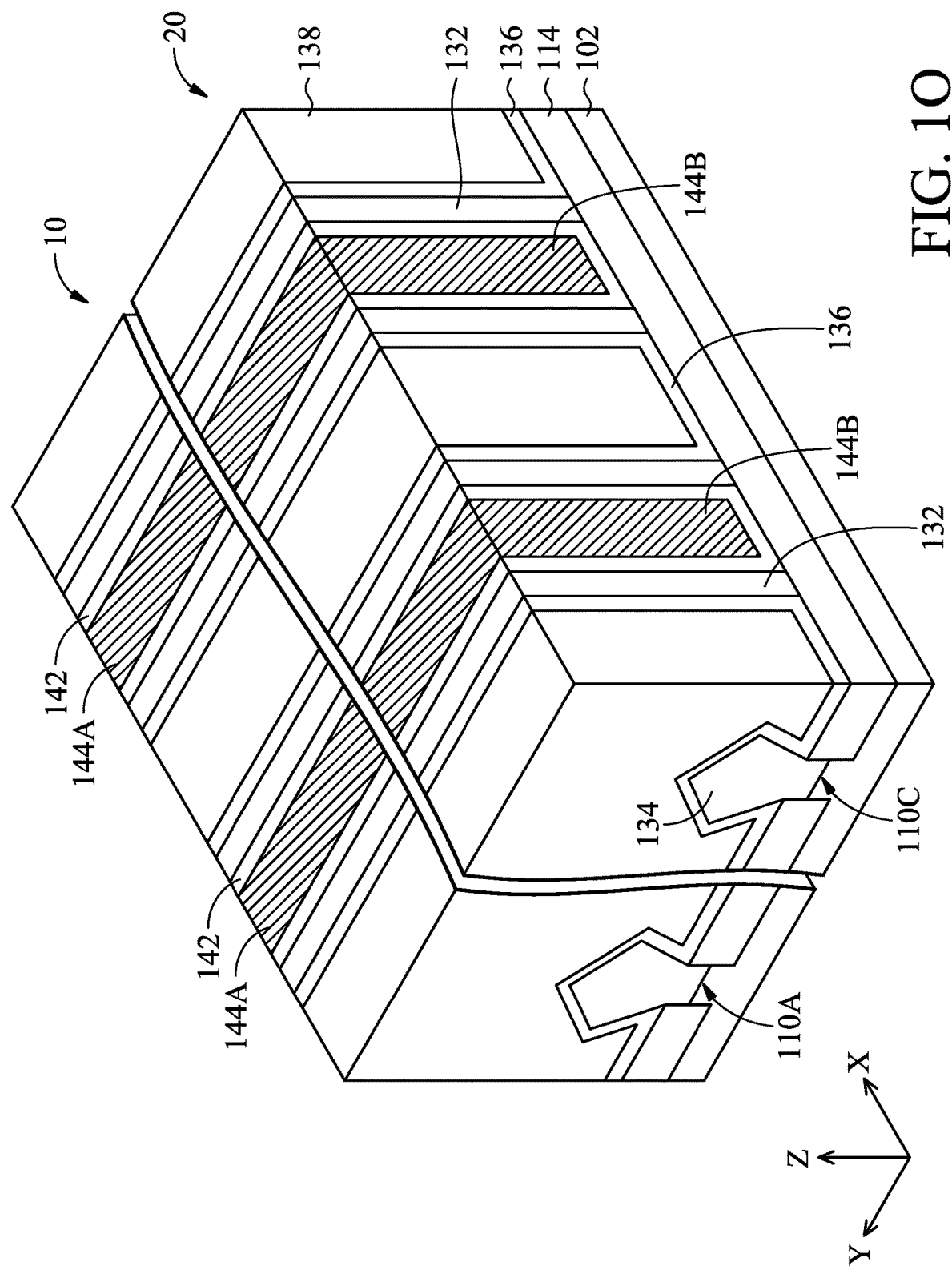

FIGS. 1A-1O are perspective representations of various stages of forming a semiconductor structure, in accordance with some embodiments of the disclosure. A substrate 102 is provided, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semi-conductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In some embodiments, the substrate 102 has a first region 10 and a second region 20. The first region 10 is disposed adjacent to the second region 20, but not limited thereto. In some embodiments, multiple first regions 10 and/or multiple second regions 20 are arranged side by side.

Afterwards, a dielectric layer 104 and a mask layer 106 are formed over the substrate 102, and a patterned photoresist layer 108 is formed over the mask layer 106, as shown in FIG. 1A in accordance with some embodiments. The patterned photoresist layer 108 may be formed by a deposition process and a patterning process.

The deposition process for forming the patterned photoresist layer 108 may include a chemical vapor deposition (CVD) process, a high-density plasma chemical vapor deposition (HDPCVD) process, a spin-on process, a sputtering process, or another applicable process. The patterning process for forming the patterned photoresist layer 108 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer 104 may be a buffer layer between the substrate 102 and the mask layer 106. In some embodiments, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 may be formed by deposition processes, which may include a chemical vapor deposition (CVD) process, a high-density plasma chemical vapor deposition (HDPCVD) process, a spin-on process, a sputtering process, or another applicable process.

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form a first fin structure 110A and a second fin structure 110B (may be referred to as "the fin structures 110A and 110B") by using the patterned dielectric layer 105 and the patterned mask layer 107 as a mask, as shown in FIG. 1B in accordance with some embodiments. The etching process may be a dry etching process or a wet etching process. In some embodiments, the first fin structure 110A is formed in the first region 10, and the second fin structure 110B is formed in the second region 20.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structures 110A and 110B reach a predetermined height. In some other embodiments, the fin structures 110A and 110B each has a width that gradually increases from the top portion to the lower portion.

After the fin structures 110A and 110B are formed, an insulating layer 112 is formed to cover the fin structures 110A and 110B, the patterned pad layer 105, and the patterned mask layer 107 over the substrate 102, as shown in FIG. 1C in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 may be a shallow trench isolation (STI) structure surrounding the fin structure 110.

In some embodiments, a portion of the fin structures 110A and 110B is embedded in the isolation structure 114. More specifically, a lower portion of the fin structures 110A and 110B is surrounded by the isolation structure 114, while an upper portion of the fin structures 110A and 110B protrudes from the isolation structure 114. The isolation structure 114 may be configured to prevent electrical interference or crosstalk. In some embodiments, the fin structures 110A and 110B have a width W after the isolation structure 114 is formed, and the width W is in a range from about 6 nm to about 10 nm. In some embodiments, the upper portion of the fin structures 110A and 110B have a length L protruding from the isolation structure 114, and the length L is in a range from about 50 nm to about 70 nm.

A first hard mask layer 116 is formed in the first region 10 and covers the first fin structure 110A and the isolation structure 114, as shown in FIG. 1E in accordance with some embodiments. After the first hard mask layer 116 is formed, the second fin structure 110B is trimmed to a first width W1, and the first width W1 is in a range from about 4 nm to about 10 nm in accordance with some embodiments. In some embodiments, the first width W1 is smaller than the width W. In some embodiments, after trimming, the second fin structure 110B has a rounded surface. Since the first fin structure 110A is protected by the first hard mask layer 116, the width of the first fin structure 110A remains as the width W in accordance with some embodiments.

A Ge-containing material 120 is formed on the second fin structure 110B, as shown in FIG. 1F in accordance with some embodiments. In some embodiments, the Ge-containing material 120 includes $Si_{1-x}Ge_x$, and x is in a range from about 0.15 to about 0.75. The Ge concentration of the Ge-containing material 120 may not be too high, or the uniformity of the Ge containing material 120 may become difficult to control. On the other hand, the Ge concentration of the Ge-containing material 120 may not be too low or the diffusion of the Ge element may not be performed effectively. In some embodiments, the Ge-containing material 120 is substantially conformally formed on a surface of the second fin structure 110B that is exposed from the isolation structure 114. In some embodiments, the Ge-containing material 120 is formed by epitaxy. In some embodiments, the Ge-containing material 120 has a thickness in a range from about 5 Å to about 30 Å. The thickness of the Ge-containing material 120 may not be too large since it may be difficult to form the Ge-containing material 120 on the second fin structure 110B and between the fin structures 110A and 110B. On the other hand, the thickness of the Ge-containing material 120 may not be too thin or it may not be enough Ge element to be diffused into the second fin structure 110B.

After the Ge-containing material 120 is formed, a second hard mask layer 118 is formed in the first region 10 and the second region 20 to cover the first hard mask layer 116, the Ge-containing material 120 and the isolation structure 114, as shown in FIG. 1F in accordance with some embodiments. In some embodiments, the Ge-containing material 120 is sandwiched between the second hard mask layer 118 and the second fin structure 110B, and the first hard mask layer 116 is sandwiched between the second hard mask layer 118 and the first fin structure 110A or between the second hard mask layer 118 and the isolation structure 114. In some embodiments, the second hard mask layer 118 has a thickness in a range from about 10 Å to about 50 Å. Examples of the first hard mask layer 116 and/or the second hard mask layer 118 may include, but are not limited to, SiN, Si, $SiO_2$, or a high-k material, such as $Al_2O_3$, $HfO_2$, etc.

An annealing process is performed to the second hard mask layer 118 and the Ge-containing material 120, as shown in FIG. 1G in accordance with some embodiments. In some embodiments, the annealing is processed under a temperature in a range from about 800° C. to about 1200° C. In some embodiments, the annealing is processed for a period of time in a range from about 5 seconds to about 100 seconds. In some embodiments, a process gas G is applied to the second fin structure 110B during the annealing, and the process gas G includes nitrogen, oxygen, ammonia, or a combination thereof. In some embodiments, the process gas G is pure nitrogen. During the annealing, the Ge element in the Ge-containing material 120 is driven to the second fin structure 110B, as shown as the arrow D in FIG. 1G in accordance with some embodiments. Under the above circumstances, the annealing process may be performed effectively, and the Ge element may diffuse into the second fin structure 110B rapidly and/or uniformly. The second hard mask layer 118 may help avoid the Ge-containing material 120 lost outwards. As such, the Ge concentration may be controlled more precisely. In some other embodiments, the second hard mask layer 118 is omitted, simplifying the manufacturing process of the semiconductor structure.

After the annealing, a modified fin structure 110C is formed, as shown in FIG. 1H in accordance with some embodiments. In some embodiments, the modified fin structure 110C includes a doped region 111A and an undoped region 111B, and the doped region 111A includes Ge element, and the undoped region 111B is substantially free from Ge element. In some embodiments, the concentration of the Ge element is substantially uniform across the doped region 111A. Since the Ge element is isotropically diffused from the Ge-containing material 120 (shown in FIG. 2C) to the second fin structure 110B, the doped region 111A includes tapered portions T, which are formed below the upper surface of the isolation structure 114 in accordance with some embodiments. A width of each of the tapered portions T gradually decreases from the upper surface of the isolation structure 114 towards the undoped region 111B.

The second hard mask layer 118 is removed after the modified fin structure 110C is formed while the first hard mask layer 116 remains on the first fin structure 110A, as shown in FIG. 1I in accordance with some embodiments.

Next, the exposed portion of the modified fin structure 110C is further trimmed while the first fin structure 110A is still protected by the first hard mask layer 116, as shown in FIG. 1J in accordance with some embodiments.

After the isolation structure 114 is formed, dummy gate structures 130 are formed across the fin structures 110A and 110C and extend over the isolation structure 114, as shown in FIG. 1K in accordance with some embodiments. In some embodiments, each of the dummy gate structures 130 includes a dummy gate dielectric layer 126 and a dummy gate electrode layer 128 formed over the dummy gate dielectric layer 126. After the dummy gate structures 130 are formed, gate spacers 132 are formed on opposite sidewalls of each of the dummy gate structures 130 in accordance with some embodiments. Each of the gate spacers 132 may be a single layer or multiple layers.

In order to improve the speed of the semiconductor structure, the gate spacers 132 may be made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the gate spacers 132 are made of an extreme low-k (ELK) dielectric material with a dielectric constant (k) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In addition, in some embodiments, the gate spacers 132 include air gaps (not shown) to further reduce their k value, such that the capacitances between the gate structures (formed subsequently) and the contacts (formed subsequently) electrically connected to the S/D structure (formed subsequently) may be reduced.

Afterwards, source/drain (S/D) structures 134 are formed over the fin structures 110A and 100C, as shown in FIG. 1L in accordance with some embodiments. In some embodiments, portions of the fin structures 110A and 110C adjacent to the dummy gate structures 130 are recessed to form recesses at two sides of the structures 110A and 110C, and a strained material is grown in the recesses by an epitaxial (epi) process to form the S/D structures 134. In addition, the lattice constant of the strained material may be different from the lattice constant of the substrate 102. In some embodiments, the S/D structures 134 include Ge, SiGe, InAs, InGaAs, InSb, GaAs, GaSb, InAlP, InP, or the like.

After the source/drain (S/D) structures 134 are formed, a contact etch stop layer (CESL) 136 is formed over the substrate 102, and an inter-layer dielectric (ILD) structure 138 is formed over the CESL 136. More specifically, the CESL 136 is formed over the S/D structures 134, the isolation structure 114, and the sidewalls of the gate spacers 132. In some embodiments, the CESL 136 is made of silicon nitride, silicon oxynitride, and/or other applicable materials. Moreover, the CESL 136 may be formed by plasma enhanced CVD, low-pressure CVD, atomic layer deposition (ALD), or other applicable processes.

In some embodiments, the ILD structure 138 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 138 may be formed by chemical vapor deposition (CVD), physical vapor deposition, (PVD), atomic layer deposition (ALD), spin-on coating, or another applicable process.

Afterwards, a planarizing process is performed on the ILD structure 138 until the top surfaces of the dummy gate structures 130 are exposed, as shown in FIG. 1M in accordance with some embodiments. After the planarizing process, the top surfaces of the dummy gate structures 130 may be substantially level with the top surfaces of the gate spacers 132 and the ILD structure 138. In some embodiments, the planarizing process includes a grinding process, a chemical mechanical polishing (CMP) process, an etching process, another applicable process, or a combination thereof.

Next, the dummy gate structures 130 are removed to form trenches 140 in the ILD structure 138, as shown in FIG. 1N in accordance with some embodiments. More specifically, each of the trenches 140 is formed between each pair of the gate spacers 132, and the fin structures 110A and 110C is exposed by the trenches 140. The dummy gate dielectric layer 126 and the dummy gate electrode layer 128 are removed by an etching process, such as a dry etching process or a wet etching process.

After the trenches 140 are formed, gate dielectric layers 142 and gate electrode layers 144A, 144B are formed in the trenches 140, as shown in FIG. 1O in accordance with some embodiments. More specifically, the gate electrode layers 144A, 144B are formed over the gate dielectric layers 142, and sidewalls of the gate electrode layers 132 may be covered by the gate dielectric layers 142. In addition, work function layers (not shown) may be formed between each of the gate dielectric layers 142 and each of the gate electrode layers 144A, 144B.

Each of the gate dielectric layers 142 may be a single layer or multiple layers. In some embodiments, the gate dielectric layers 142 are made of silicon oxide, silicon nitride, silicon oxynitride (SiON), dielectric material(s) with high dielectric constant (high-k), or a combination thereof. In some embodiments, the gate dielectric layers 142 are deposited by a plasma enhanced chemical vapor deposition (PECVD) process or a spin coating process.

Moreover, the gate electrode layers 144A, 144B are made of a conductive material such as aluminum (Al), copper (Cu), tungsten (W), titanium (Ti), tantalum (Ta), or another applicable material, in accordance with some embodiments. The gate electrode layers 144A, 144B may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

Figure 2:
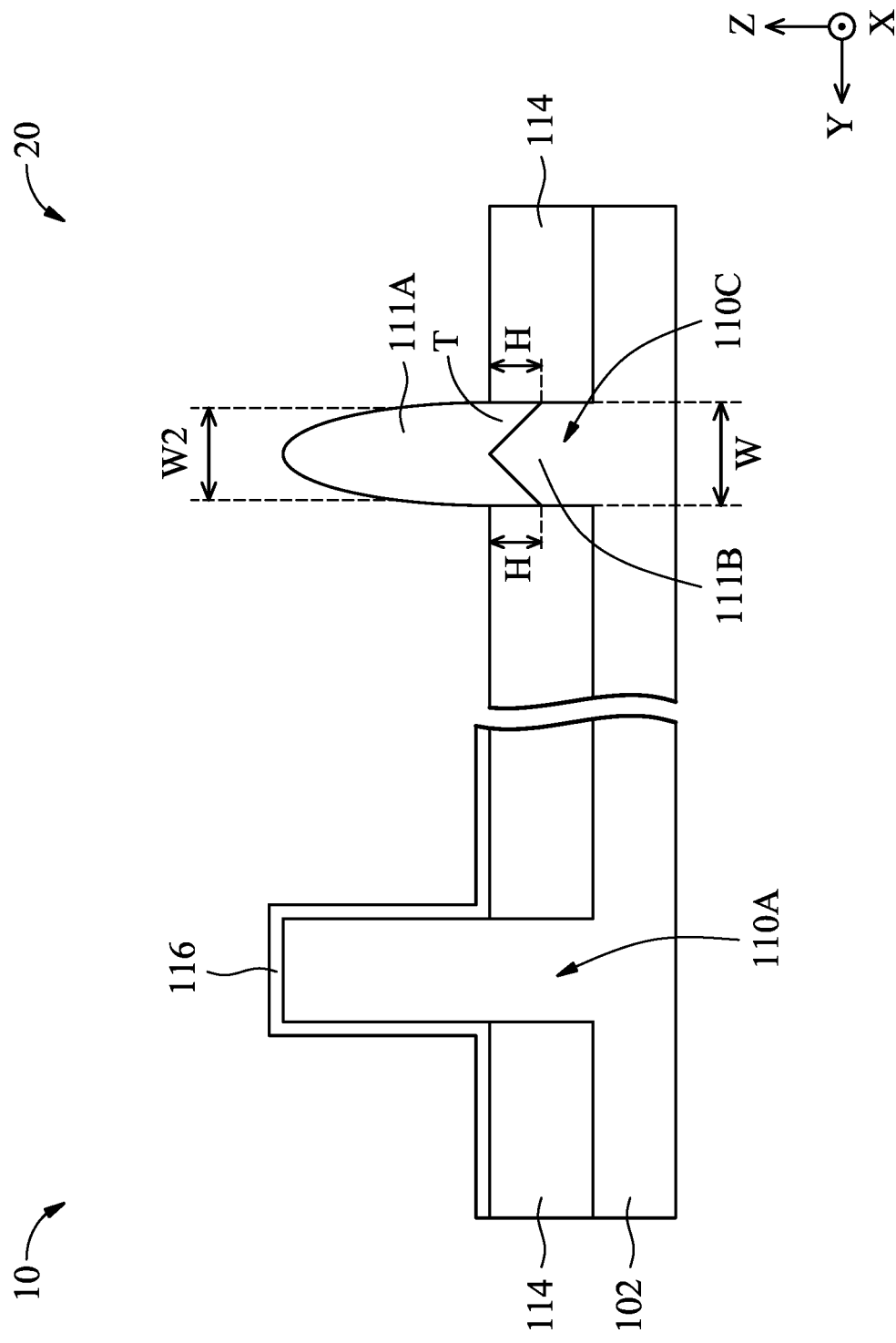
FIG. 2 is a cross-sectional representation of a modified fin structure, in accordance with some embodiments of the disclosure.

FIG. 2 is a cross-sectional representation of the first fin structure 110A and the modified fin structure 110C (which is referred to as "the fin structures 110A and 110C" hereinafter) illustrated along the line C-C shown in FIG. 1J in accordance with some embodiments of the disclosure. In some embodiments, the exposed portion of the modified fin structure 110C is trimmed to a second width W2, and the second width W2 is in a range from about 3 nm to about 8 nm. In some embodiments, the second width W2 is shorter than the width W. In some embodiments, a depth H of each of the tapered portions T is in a range from about 1 nm to about 30 nm. The depth H is measured from a top surface of the isolation structure 114 to an end of the tapered portions T.

Figure 3:
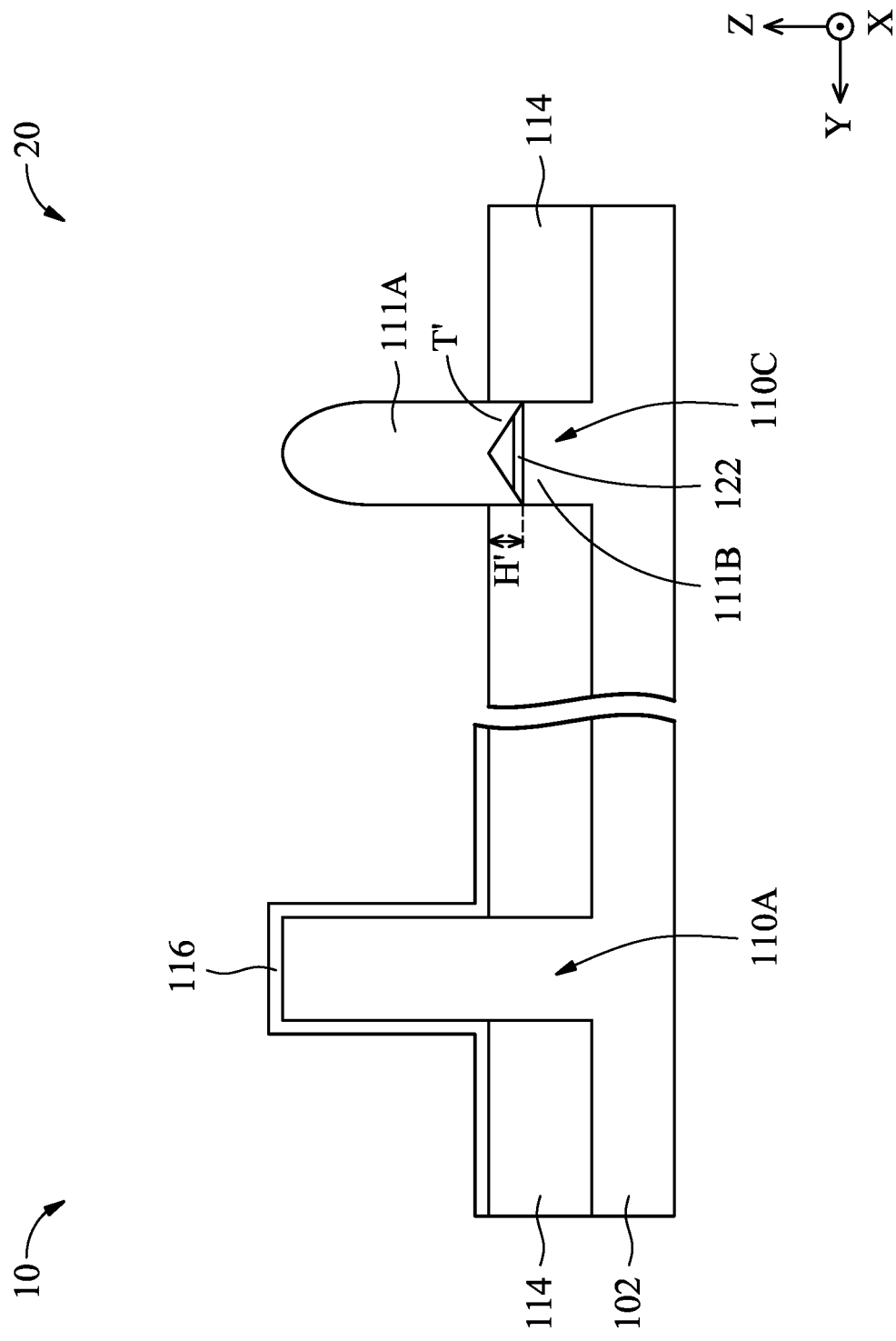
FIG. 3 is a cross-sectional representation of a modified fin structure, in accordance with some embodiments of the disclosure.

FIG. 3 is a cross-sectional representation of the fin structures 110A and 110C, in accordance with some embodiments of the disclosure. The fin structure 110C may be similar to the fin structure 100B described above, except an anti-punch-through (APT) region 122 is formed at the lower portion of the fin structure in accordance with some embodiments. Processes and materials for forming the structure shown in FIG. 3 may be similar to, or the same as those for forming the structure shown in FIGS. 1A-1O and described above and are not repeated herein.

More specifically, an anti-punch-through (APT) region 122 is formed in the modified fin structure 110C, as shown in FIG. 3 in accordance with some embodiments. The APT region 122 may be used to offer greater protection against punch-through. As a result, current leakage caused by punch-through may be reduced or prevented. In some embodiments, the APT region 122 is doped with suitable dopants, such as p-type dopants or n-type dopants. The tapered portions T' of the doped region 111A may extend towards and reach the APT region 122, and the APT region may 122 serve as a stop layer for the tapered portions T'. In some embodiments, the tapered portions T' abuts and would not penetrate the APT region 122. The slope and the depth H' of the tapered portions T' may be reduced due to the formation of the APT region 122, compared to the structure shown in FIG. 2. As such, the depth H' of the tapered portions T' may be shorter than the depth H of the tapered portions T. In some embodiments, the depth H' of the tapered portions T' is in a range from about 1 nm to about 25 nm.

Figure 4:
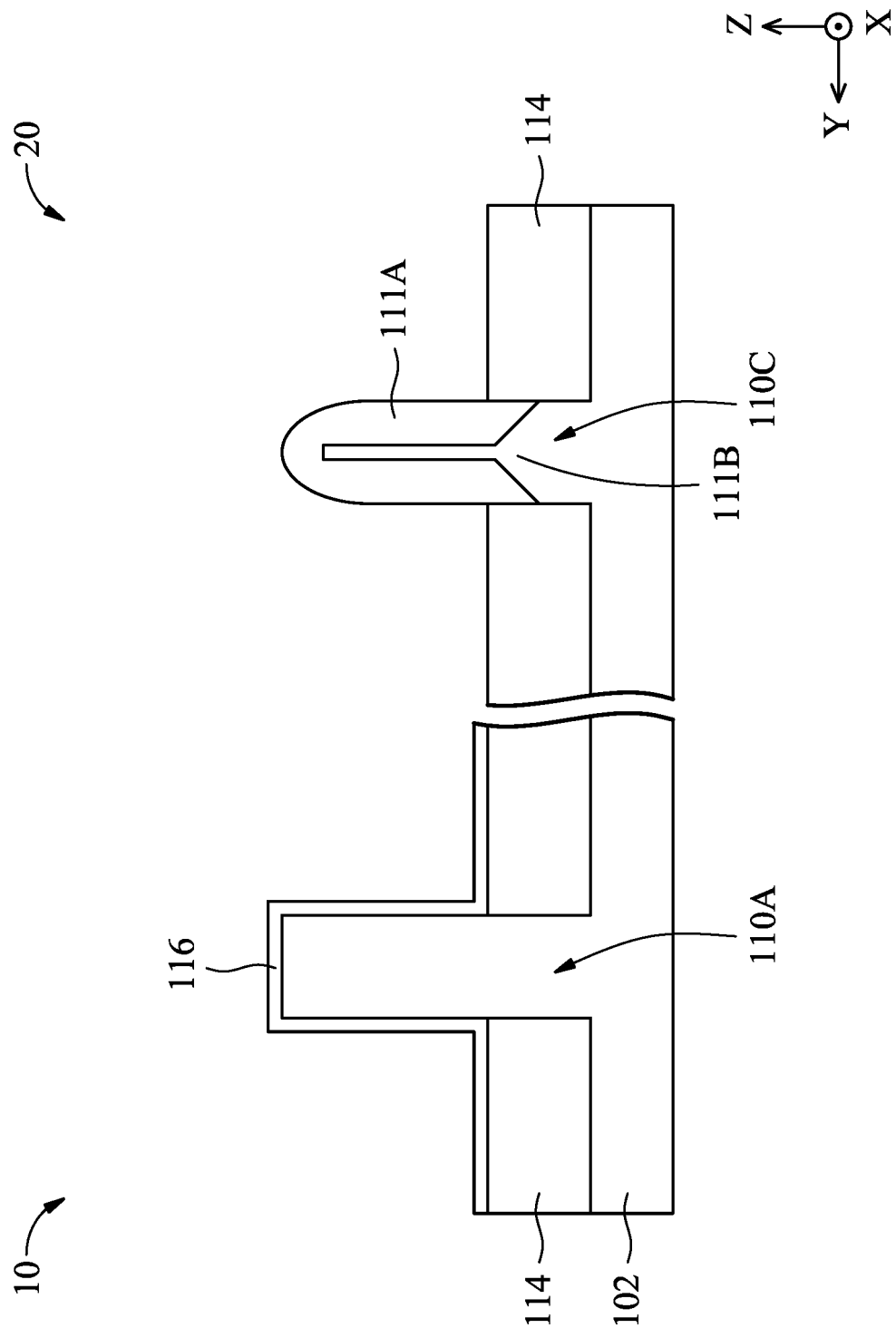
FIG. 4 is a cross-sectional representation of a modified fin structure, in accordance with some embodiments of the disclosure.

FIG. 4 is a cross-sectional representation of the fin structures 110A and 110C, in accordance with some embodiments of the disclosure. As shown in FIG. 4 in accordance with some embodiments, the undoped region 111B extends to a center of the modified fin structure 110C and is surrounded by the doped region 111A. In some embodiments, the undoped region 111B has an elongated portion in the center of the modified fin structure 110C. In some embodiments, the width of the elongated portion of the undoped region 111B is smaller than the width of the modified fin structure 110C. In some embodiments, the width of the undoped region 111B gradually increases from the bottom of the elongated portion to the bottom of the isolation structure 114. In some embodiments, the width of the elongated portion of the undoped region 111B is in a range from about 0.1 nm to about 5 nm. In some embodiments, a Ge concentration of the modified fin structure 110C decreases from a surface (such as the doped region 111A) of the modified fin structure 110C to a center (such as the undoped region 111B) of the modified fin structure HOC. Similarly, processes and materials for forming the structure shown in FIG. 4 may be similar to, or the same as, those for forming the structure shown in FIGS. 1A-1O and described above and are not repeated herein.

Figure 5:
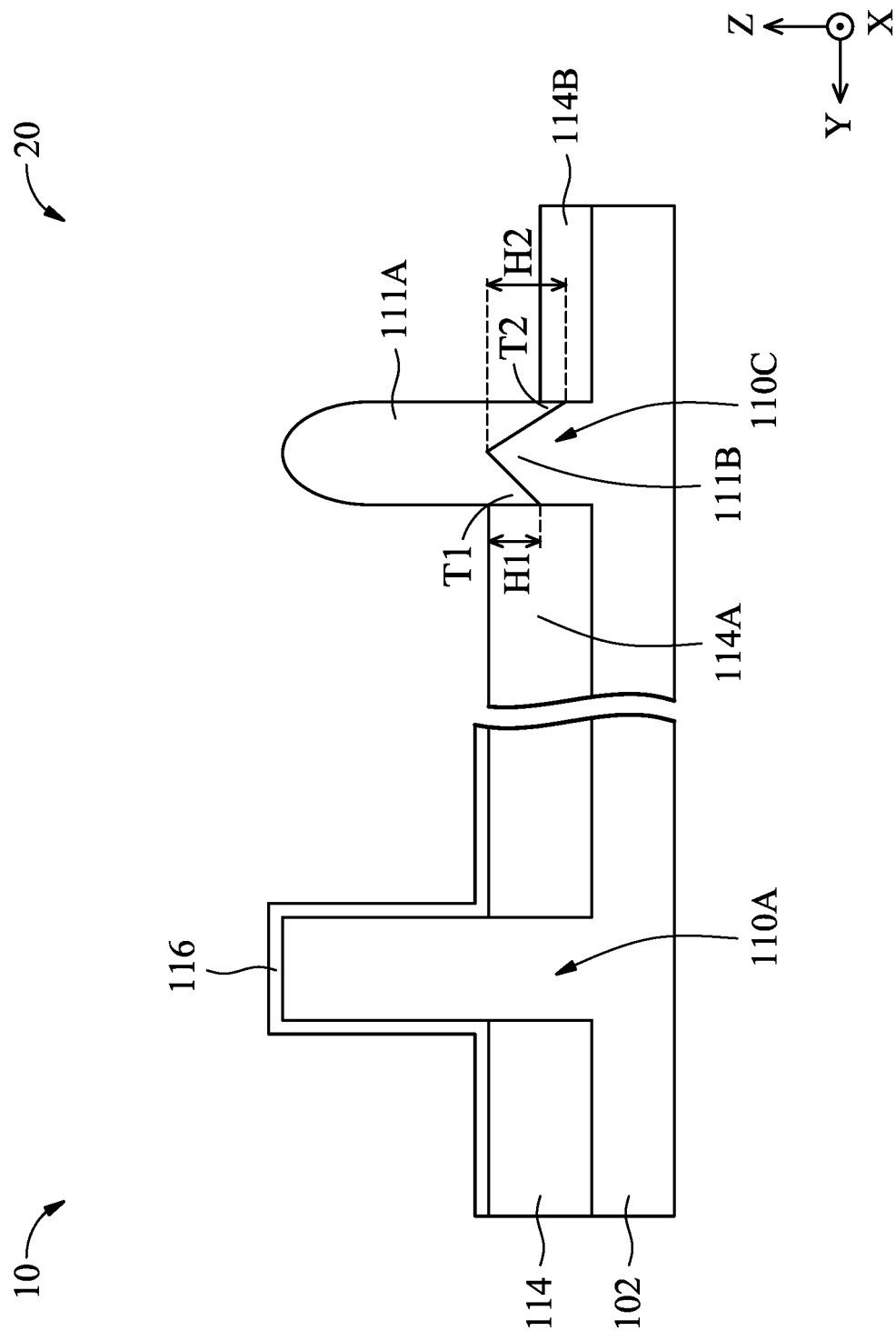
FIG. 5 is a cross-sectional representation of a modified fin structure, in accordance with some embodiments of the disclosure.

FIG. 5 is a cross-sectional representation of the fin structures 110A and HOC, in accordance with some embodiments of the disclosure. As shown in FIG. 5 in accordance with some embodiments, the isolation structure 114 has two isolation regions 114A and 114B, and the isolation regions 114A and 114B are located on opposite sides of the modified fin structure 110C. In some embodiments, a difference of height is formed between the top surfaces of the isolation regions 114A and 114B, and the top surface of the isolation region 114A is higher than the top surface of the isolation region 114B. In some embodiments, the doped region 111A in the modified fin structure 110C is asymmetric. In some embodiments. the doped region 111A has a tapered portion T1 and another tapered portion T2, the tapered portion T1 is adjacent to the isolation region 114A, and the tapered portion T2 is adjacent to the isolation region 114B. In some embodiments, since the top surfaces of the isolation regions 114A and 114B are not flush, the tapered portion T2 extends lower than the tapered portion T1. In some embodiments, a depth H1 of the tapered portion T1 is in a range from about 1 nm to about 25 nm, and a depth H2 of the tapered portion T2 is in a range from about 1 nm to about 40 nm. In some embodiments, the depth H1 is shorter than the depth H2. Similarly, processes and materials for forming the structure shown in FIG. 5 may be similar to, or the same as those for forming the structure shown in FIGS. 1A-1O and described above and are not repeated herein.

In some embodiments, a modified fin structure HOC including SiGe may be formed by covering a Ge-containing material 120 on a fin structure 110B made of Si and annealing the Ge-containing material 120 and the fin structure 110B to drive Ge elements into the fin structure HOB. As such, the width and the Ge concentration of the modified fin structure 110C may be properly controlled. In some embodiments, a hard mask layer 118 covers the Ge-containing material 120 for preserving the Ge element in the Ge-containing material 120, and therefore the deviation of the Ge concentration of the modified fin structure 110C may be reduced. In some embodiments, an anti-punch-through (APT) region 122 is formed in the modified fin structure 110C for reducing the depth H' of the tapered portions T' of the modified fin structure 110C.

Embodiments of a semiconductor structure and method for forming the same are provided. The semiconductor structure may include a modified fin structure which is formed by annealing the fin structure and a Ge-containing material covering thereon. Ge elements in the Ge-containing material may be driven into the fin structure, forming a SiGe channel via a solid phase diffusion process. Since the Ge-containing material is formed, the composition and the width of the modified fin structure may be precisely controlled. Therefore, the over oxidized SiGe fin may be avoided, and/or a better N-bias/P-bias may be reached. In addition, some embodiments of the present disclosure provide parameters for performing the solid phase diffusion process properly, and the deviation of the composition and the profile of the modified fin structure may be further reduced.

In some embodiments, a method for forming a semiconductor structure is provided. The method includes forming a fin structure over a substrate and forming an isolation structure over the substrate. In addition, the fin structure is protruded from the isolation structure. The method further includes trimming the fin structure to a first width and forming a Ge-containing material covering the fin structure. The method further includes annealing the fin structure and the Ge-containing material to form a modified fin structure. The method also includes trimming the modified fin structure to a second width.

In some embodiments, a method for forming a semiconductor structure is provided. The method includes forming a first fin structure and a second fin structure over a substrate. The second fin structure is adjacent to the first fin structure. The method further includes forming an isolation structure over the substrate. The first fin structure and the second fin structure are protruded from the isolation structure. The method includes forming a first hard mask layer covering the first fin structure. The method further includes trimming the second fin structure. A first width of the first fin structure is greater than a second width of the second fin structure. The method includes forming a Ge-containing material covering the second fin structure. The method also includes annealing the second fin structure and the Ge-containing material to form a modified second fin structure. The method further includes trimming the modified second fin structure to a third width. The first width is greater than the third width.

In some embodiments, a semiconductor structure is provided. The semiconductor structure includes an isolation structure formed over a substrate. The semiconductor structure further includes a first fin structure protruded from the isolation structure. The first fin structure is doped with Ge element, and a profile of the Ge element in the first fin structure extends below a top surface of the isolation structure. A doped region is formed in the first fin structure, and the doped region has a tapered portion extending below the top surface of the isolation structure. The semiconductor structure further includes a gate structure formed over the first fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a fin structure over a substrate;
   forming an isolation structure over the substrate, wherein the fin structure is protruded from the isolation structure;
   trimming the fin structure to a first width;
   forming a Ge-containing material covering the fin structure;

annealing the fin structure and the Ge-containing material to form a modified fin structure; and trimming the modified fin structure to a second width.

2. The method as claimed in claim 1, further comprising forming a hard mask layer covering the Ge-containing material.

3. The method as claimed in claim 2, further comprising removing the hard mask layer after the annealing is performed.

4. The method as claimed in claim 1, wherein a Ge concentration of the modified fin structure decreases from a surface of the modified fin structure to a center of the modified fin structure after the annealing.

5. The method as claimed in claim 1, wherein when the annealing is performed, Ge diffuses from the Ge-containing material to the fin structure, and a profile of Ge in the modified fin structure extends below a top surface of the isolation structure.

6. The method as claimed in claim 1, further comprising applying a process gas during the annealing, wherein the process gas comprises nitrogen, oxygen, ammonia, or a combination thereof.

7. The method as claimed in claim 1, wherein the first width of the fin structure is greater than the second width of the modified fin structure.

8. A method for forming a semiconductor structure, comprising:

forming a first fin structure and a second fin structure over a substrate, wherein the second fin structure is adjacent to the first fin structure;

forming an isolation structure over the substrate, wherein the first fin structure and the second fin structure are protruded from the isolation structure;

forming a first hard mask layer covering the first fin structure;

trimming the second fin structure, wherein a first width of the first fin structure is greater than a second width of the second fin structure;

forming a Ge-containing material covering the second fin structure;

annealing the second fin structure and the Ge-containing material to form a modified second fin structure; and trimming the modified second fin structure to a third width, wherein the first width is greater than the third width.

9. The method as claimed in claim 8, further comprising forming a second hard mask layer covering the Ge-containing material.

10. The method as claimed in claim 9, wherein the second hard mask layer has a thickness in a range from 10 Å to 50 Å.

11. The method as claimed in claim 9, further comprising removing the second hard mask layer after the annealing is performed.

12. The method as claimed in claim 11, further comprising maintaining the first hard mask layer while removing the second hard mask layer.

13. The method as claimed in claim 8, wherein the Ge-containing material has a thickness in a range from 5 Å to 30 Å prior to the annealing.

14. The method as claimed in claim 8, wherein the Ge-containing material comprises $Si_{1-x}Ge_x$, and x is in a range from 0.15 to 0.75 prior to the annealing.

15. A method for forming a semiconductor structure, comprising:

forming a fin structure over a substrate;

forming an isolation structure over the substrate, wherein the fin structure is protruded from the isolation structure;

forming a Ge-containing material covering the fin structure; and annealing the fin structure and the Ge-containing material to form a t Codified fin structure, wherein annealing the fin structure and the Ge-containing material comprises forming a profile of the Ge element in the modified fin structure, and the profile of the Ge element has a tapered portion extending below a top surface of the isolation structure.

16. The method as claimed in claim 15, wherein forming the Ge-containing material is by epitaxy.

17. The method as claimed in claim 15, wherein annealing the fin structure and the Ge-containing material is processed under a temperature in a range from about 800° C. to about 1200° C.

18. The method as claimed in claim 15, wherein annealing the fin structure and the Ge-containing material is processed for a period of time in a range from about 5 seconds to about 100 seconds.

19. The method as claimed in claim 15, further comprising:

trimming an exposed portion of the modified fin structure from the isolation structure to a width in a range from about 3 nm to about 8 nm.

20. The method as claimed in claim 15, wherein the tapered portion has a depth lower than the top surface of the isolation structure, and the depth is in a range from about 1 nm to about 30 nm.

* * * * *